United States Patent
Hu et al.

(10) Patent No.: US 9,647,204 B2
(45) Date of Patent: May 9, 2017

(54) SPIN TORQUE MRAM BASED ON CO, IR SYNTHETIC ANTIFERROMAGNETIC MULTILAYER

(71) Applicant: International Business Machines Corporation, Armonk, NY (US)

(72) Inventors: Guohan Hu, Yorktown Heights, NY (US); Luqiao Liu, Yorktown Heights, NY (US); Jonathan Z. Sun, Shrub Oak, NY (US); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/561,690

(22) Filed: Dec. 5, 2014

(65) Prior Publication Data

US 2016/0163966 A1 Jun. 9, 2016

(51) Int. Cl.
*H01L 43/10* (2006.01)
*G11C 11/16* (2006.01)
*H01L 43/02* (2006.01)
*H01L 43/08* (2006.01)

(52) U.S. Cl.
CPC ............ *H01L 43/10* (2013.01); *G11C 11/161* (2013.01); *G11C 11/1675* (2013.01); *H01L 43/02* (2013.01); *H01L 43/08* (2013.01)

(58) Field of Classification Search
CPC .... G11C 11/161; G11C 11/1675; H01L 43/10
See application file for complete search history.

(56) References Cited

U.S. PATENT DOCUMENTS

| | | | |
|---|---|---|---|
| 7,663,197 B2 | 2/2010 | Nagase et al. | |
| 8,378,330 B2 | 2/2013 | Horng et al. | |
| 8,508,006 B2 | 8/2013 | Jan et al. | |
| 8,760,154 B2 | 6/2014 | Giddings et al. | |
| 2011/0062537 A1* | 3/2011 | Oh | B82Y 25/00 257/421 |
| 2011/0260272 A1* | 10/2011 | Lee | B82Y 25/00 257/421 |

(Continued)

OTHER PUBLICATIONS

S. Colis et al., "Magnetic, transport, and structural properties of Fe/Co/Cu/[Co/Ir/Co] sandwiches and Fe/Co/Cu/[Co/Ir] multilayers prepared by ion-beam sputtering," Physical Review B, vol. 62, No. 17, Nov. 2000, 11709.

(Continued)

*Primary Examiner* — Tri Hoang
(74) *Attorney, Agent, or Firm* — Vazken Alexanian; Michael J. Chang, LLC (57) ABSTRACT

Magnetic memory devices having an antiferromagnetic reference layer based on Co and Ir are provided. In one aspect, a magnetic memory device includes a reference magnetic layer having multiple Co-containing layers oriented in a stack, wherein adjacent Co-containing layers in the stack are separated by an Ir-containing layer such that the adjacent Co-containing layers in the stack are anti-parallel coupled by the Ir-containing layer therebetween; and a free magnetic layer separated from the reference magnetic layer by a barrier layer. A method of writing data to a magnetic random access memory device having at least one of the present magnetic memory cells is also provided.

15 Claims, 6 Drawing Sheets

(56) References Cited

U.S. PATENT DOCUMENTS

| | | | |
|---|---|---|---|
| 2011/0293967 A1 | 12/2011 | Zhang et al. | |
| 2013/0224521 A1* | 8/2013 | Wang | G11B 5/66 428/828 |
| 2014/0015076 A1* | 1/2014 | Gan | H01L 43/08 257/421 |
| 2014/0306302 A1 | 10/2014 | Jan et al. | |
| 2015/0263266 A1* | 9/2015 | Gottwald | H01L 43/08 365/158 |

OTHER PUBLICATIONS

S. Colis et al., "Magnetic, transport and structural properties of Co/Ir multilayers grown by molecular beam epitaxy," physica status solidi (a), vol. 199, No. 2, Sep. 2003, pp. 161-168.

B.M. Aiqassem et al., "Magnetic exchange coupling of Co/Ir multilayers," The European Physical Journal, vol. 62, No. 4, May 2008, pp. 433-438.

S. Mangin et al., "Engineered materials for all-optical helicity-dependent magnetic switching," Nature materials, vol. 13, No. 3, Feb. 2014, pp. 286-292.

Worledge et al., "Spin torque switching of perpendicular Ta|CoFeB|MgO-based magnetic tunnel junctions," Applied Physics Letters 98, 022501 (Jan. 2011).

Sinha et al., "Enhanced interface perpendicular magnetic anisotropy in Ta|CoFeB|MgO using nitrogen doped Ta underlayers," arXiv:1305.6660 (Jun. 2013).

\* cited by examiner

SPIN TORQUE MRAM BASED ON CO, IR SYNTHETIC ANTIFERROMAGNETIC MULTILAYER

FIELD OF THE INVENTION

The present invention relates to magnetic memory devices and more particularly, to magnetic memory devices having an antiferromagnetic reference layer based on cobalt (Co) and iridium (Ir).

BACKGROUND OF THE INVENTION

Semiconductor devices, such as magnetic random access memory (MRAM) devices, use magnetic memory cells to store information. Information is stored in the magnetic memory cells as an orientation of the magnetization of a free layer in the magnetic memory cell as compared to an orientation of the magnetization of a fixed (e.g., reference) layer in the magnetic memory cell. The free layer and the fixed layer, separated by a tunnel barrier, form a magnetic tunnel junction.

The magnetization of the free layer can be oriented parallel or anti-parallel relative to the fixed layer, representing either a logic "1" or a logic "0." The orientation of the magnetization of a given layer (fixed or free) may be represented by an arrow pointing either to the left or to the right. When the magnetic memory cell is sitting in a zero applied magnetic field, the magnetization of the magnetic memory cell is stable, pointing either left or right. Driving a current through the magnetic tunnel junction can cause the magnetization of the free layer to switch due to spin transfer torque from left to right, and vice versa, to write information to the magnetic memory cell. See, for example, Worledge et al., "Spin torque switching of perpendicular Ta|CoFeB-|MgO-based magnetic tunnel junctions," Applied Physics Letters 98, 022501 (January 2011) (hereinafter "Worledge"), the contents of which are incorporated by reference as if fully set forth herein. As described in Worledge, with spin torque MRAM devices perpendicular magnetic anisotropy greatly reduces the switching voltage.

To achieve a reliable reading and writing on spin torque MRAM devices, a stable reference layer is a key prerequisite. The reference layer has to be rigid both under magnetic field and under the application of current. Therefore, an ideal reference layer has to own a large coercive field and a strong anisotropy energy density. Meanwhile, in order to operate the MRAM device under zero or small external magnetic field, the reference layer has to induce a minimal dipole field on the free layer. This means that the magnetic moment of the reference layer has to be largely internally canceled. For instance, multilayer structures based on cobalt (Co)/platinum (Pt) (or Co/palladium (Pd), Co/nickel (Ni), etc.) have been proposed for use as a reference layer in MRAM devices. However, the $[Co/Pt]_N$ multilayers are ferromagnetically aligned and as such the magnetic moments of the neighboring Co layers are parallel coupled. Thus, a dipole moment will build up and, without a large external offset field, this type of reference layer will undesirably exert a large dipole magnetic field onto the free layer.

To overcome this issue, it was proposed in Worledge to insert ruthenium (Ru) between the Co/Pt layers, i.e., resulting in a $[Co/Pt]_N/Ru/[Co/Pt]_N$ structure. By inserting Ru, the magnetic moment of the $[Co/Pt]_N$ multilayer on top of the Ru will point in the opposite direction of the magnetic moment of the $[Co/Pt]_N$ multilayer below the Ru, cancelling each other out, and thus solving the issue of a large dipole moment. However, there are some notable drawbacks to use of Ru. First, the perpendicular magnetic anisotropy is usually compromised because of the introduction of Ru. Second, Ru diffuses throughout the layers during high temperature anneals compromising function of the device. Moreover, reference layers made from Co/Pt usually have poor performance in thermal stability. The perpendicular anisotropy and the magnetoresistance of the magnetic tunnel junction will degrade after high temperature annealing because of the diffusion of Pt (or Ni, Pd) in those materials.

Therefore, a stable and low dipole field reference layer for perpendicular magnetic anisotropy spin torque MRAM devices would be desirable.

SUMMARY OF THE INVENTION

The present invention provides magnetic memory devices having an antiferromagnetic reference layer based on cobalt (Co) and iridium (Ir). In one aspect of the invention, a magnetic memory cell is provided. The magnetic memory cell includes a reference magnetic layer having multiple Co-containing layers oriented in a stack, wherein adjacent Co-containing layers in the stack are separated by an Ir-containing layer such that the adjacent Co-containing layers in the stack are anti-parallel coupled by the Ir-containing layer therebetween; and a free magnetic layer separated from the reference magnetic layer by a barrier layer.

In another aspect of the invention, a method of writing data to a magnetic random access memory device having a plurality of word lines oriented orthogonal to a plurality of bit lines, and a plurality of magnetic memory cells configured in an array between the word lines and bit lines is provided. The method includes the steps of: providing a word line current to a given one of the word lines to select all of the magnetic memory cells along the given word line, providing a bit line current to each of the bit lines corresponding to the selected magnetic memory cells; removing the word line current; and removing the bit line current. At least one of the selected magnetic memory cells includes: a reference magnetic layer having multiple Co-containing layers oriented in a stack, wherein adjacent Co-containing layers in the stack are separated by an Ir-containing layer such that the adjacent Co-containing layers in the stack are anti-parallel coupled by the Ir-containing layer therebetween; and a free magnetic layer separated from the reference magnetic layer by a barrier layer.

In yet another aspect of the invention, another magnetic memory cell is provided. The magnetic memory cell includes: a reference magnetic layer having multiple subsystems of layers oriented in a stack, wherein each of the subsystems of layers includes a first Co-containing layer separated from a second Co-containing layer by a platinum (Pt)-containing layer such that the first Co-containing layer and the second Co-containing layer are parallel coupled by the Pt-containing layer therebetween, and wherein adjacent subsystems of layers in the stack are separated by an Ir-containing layer such that the adjacent subsystems of layers in the stack are anti-parallel coupled by the Ir-containing layer therebetween; and a free magnetic layer separated from the reference magnetic layer by a barrier layer.

A more complete understanding of the present invention, as well as further features and advantages of the present invention, will be obtained by reference to the following detailed description and drawings.

DETAILED DESCRIPTION OF PREFERRED EMBODIMENTS

Provided herein are perpendicular magnetic anisotropy spin torque MRAM devices (also referred to herein as "perpendicular spin torque MRAM devices") having magnetic memory cells with multilayer cobalt (Co) and iridium (Ir)-based reference layers. As described above, magnetic memory cells generally include a free layer and a fixed (or reference) layer separated by a tunnel barrier, forming a magnetic tunnel junction. In this case, the reference layer includes a synthetic antiferromagnetic multilayer having alternating Co- and Ir-containing layers. The term "synthetic" is used to differentiate the present antiferromagnetic multilayer reference layer from real, natural antiferromagnetic materials (i.e., in real, natural antiferromagnetic materials the neighboring magnetic atoms are anti-parallel aligned and thus one would not need to create the kind of multilayer repeat structure provided herein).

Like ruthenium (Ru), Ir effects anti-parallel coupling of the Co-containing layers. Therefore, as provided above, the net result is that the magnetic moments of the Co-containing layers cancel each other out resulting in a low dipole field (i.e., less than about 300 oersted (Oe)). However unlike Ru, Ir advantageously strengthens the perpendicular magnetic anisotropy thus making the multilayer reference layer stack more stable. Without being bound by any particular theory, it is thought that even though Ru and Ir are similar elements the relatively larger atomic number of Ir affords a greater perpendicular magnetic anisotropy. As a result, with the present device configurations it is desirable to use multiple Ir-containing layers in the reference layer stack—see below. By comparison, since Ru generally compromises the perpendicular magnetic anisotropy (see above), reference layers so configured to include Ru typically limit the Ru to a single layer in the stack.

Figure 1:
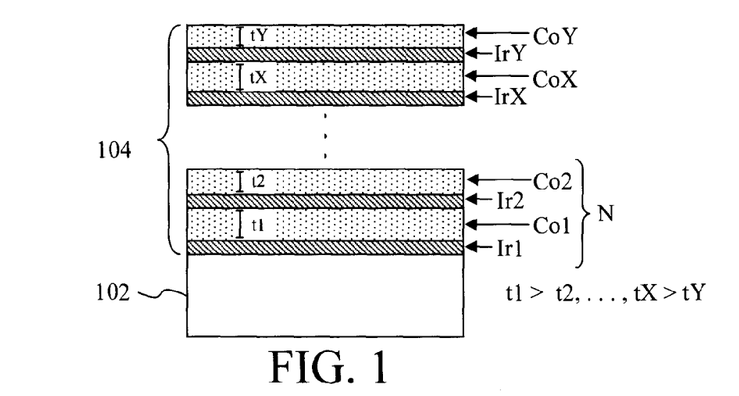
FIG. 1 is a cross-sectional diagram illustrating a reference layer having been formed on a (e.g., seeding layer) substrate, wherein the reference layer includes a stack of multiple cobalt (Co)-containing layers separated by iridium (Ir)-containing layers, and wherein a thickness of the Co-containing layers varies based on their location within the stack according to an embodiment of the present invention.

An exemplary methodology for forming a magnetic memory cell according to the present techniques is now described by way of reference to FIGS. 1-5. As shown in FIG. 1, the process begins with the formation of the reference magnetic layer (or simply "reference layer") which in this exemplary embodiment includes multiple Co-containing layers oriented in a stack. As will be described in detail below, an Ir-containing layer is present between each of the adjacent Co-containing layers in the stack.

In the exemplary embodiment shown, this multilayer reference layer (depicted generally as reference layer 104) is formed on a substrate 102. Preferably, the substrate 102 is configured to serve as a seeding layer which provides a proper texture for building the reference layer constituent films. For instance, employing a (111) orientation in the crystal structure of the Co- and Ir-containing layers has been found to enhance the perpendicular magnetic anisotropy of the reference layer stack. Suitable seeding layer materials which induce a (111) crystallographic orientation of the Co- and Ir-containing layers include, but are not limited to, platinum (Pt), Ru, and Ir. According to an exemplary embodiment, the seeding layer has a thickness of greater than about 5 nanometers (nm), for example, from about 5 nm to about 50 nm, and ranges therebetween. Of these seeding materials, Pt and Ir should have a face centered cubic (FCC) structure, while Ru is usually hexagonal close-packed (HCP). FCC 111 and HCP 001 orientations are similar in that they both give a close compact structure and can both give textures for the FCC 111 layers grown on top thereof (the Co- and Ir-containing multilayer in this case). Both Co and Ir have a FCC structure. The 111 orientation is the closed pack direction, meaning that the overall energy will be the lowest if the film grows along this direction. Thus, if the Co- and Ir-containing layers start with the correct texture, this orientation will be carried over to the whole thickness. The fact that Ir has the smallest lattice mismatch with Ir/Co makes it particularly well suited for use as a seeding layer in this case, and has been found by way of experimentation to give rise to the strongest perpendicular magnetic anisotropy in the present magnetic memory cell. See below.

Next, as shown in FIG. 1, a multilayer stack of alternating Co- and Ir-containing layers are formed on the substrate 102. This multilayer stack will form the reference layer 104 of the present magnetic memory cell.

As shown in FIG. 1, and as described below, one of the Ir-containing layers will be present between each of the adjacent Co-containing layers in the stack. These Ir-containing layers serve to anti-parallel couple the Co-containing layers. By anti-parallel coupling (also referred to herein as "anti-ferromagnetic coupling") the Co-containing layers in the stack have the net dipole moment is small. Thus, the reference layer induces at most a minimal dipole field on the free layer. Further, since the presence of the Ir-containing layers in the stack actually strengthens the perpendicular magnetic anisotropy (see above) here one can afford to have as many Ir-containing layers as possible. By comparison, the Ru employed in conventional configurations compromises the perpendicular magnetic anisotropy, and thus reference layers so configured to include Ru typically limit the Ru to a single layer in the stack.

Any suitable process known in the art may be employed to deposit/form the constituent layers of the reference layer stack. By way of example only, each of the layers of the present magnetic memory cell may be formed using a sputtering deposition technique, such as direct current (DC) sputtering. It would be within the capabilities of one skilled in the art to configure a sputtering or other standard deposition process to produce layers of the present materials having the particular compositions, thicknesses, etc. described herein.

Referring to FIG. 1, the process for forming the reference layer 104 begins by forming a first Ir-containing layer on the substrate 102. As provided above, the substrate 102 is preferably configured to serve (i.e., based on its composition, thickness, etc.) as a seeding layer to grow Ir- and Co-containing layers thereon having a (111) crystallographic orientation. According to an exemplary embodiment, the Ir-containing layer is formed on the substrate 102 having a thickness of from about 4 angstroms (Å) to about 9 Å, and ranges therebetween, for example, from about 4.5 Å to about 5 Å, and ranges therebetween. As described above, the Ir-containing layers serve to anti-parallel couple the Co-containing layers in the stack thereby minimizing the net dipole moment. Thus, according to an exemplary embodiment, an Ir-containing layer thickness is chosen that gives the best anti-parallel coupling (based, for example, on electrical characteristics of test samples—see below) between Co-containing layers (for example a thickness within the ranges provided above), and then that same thickness is employed for each of the Ir-containing layers in the stack.

Next, as shown in FIG. 1, a first Co-containing layer Co1 is formed on a side of the first Ir-containing layer Ir1 opposite the substrate 102, a second Ir-containing layer Ir2 is formed on a side of the first Co-containing layer Co1 opposite the first Ir-containing layer Ir1, and a second Co-containing layer Co2 is then formed on a side of the second Ir-containing layer Ir2 opposite the first Co-containing layer Co1, etc. For ease and clarity of description, each of the Ir- and Co-containing layers in the stack are given the designation Ir1, Co1, Ir2, Co2, . . . , IrX, CoX, IrY, CoY which correspond to the first (Ir- and Co-containing layers), the second (Ir- and Co-containing layers), $X^{th}$ (Ir- and Co-containing layers), and $Y^{th}$ (Ir- and Co-containing layers) being formed. Each pair of Co-containing layers (i.e., Co1/Co2, . . . , CoX/CoY) are anti-parallel coupled via the Ir-containing layer therebetween. As shown in the figures, the stack will end up having N number of pairs of the Co-containing layers. Having an even number of Co-containing layers (i.e., the Co-containing layers are present in the stack as (anti-parallel coupled) pairs) ensures that the magnetic moments of Co-containing layers cancel each other out. According to an exemplary embodiment, N is from 1 to 5, and ranges therebetween, e.g., N is 3. It is thus notable that while FIG. 1 shows multiple anti-parallel coupled pairs, this is done to illustrate how the repeating pairs would be oriented in the stack, and the stack could in some exemplary embodiments include a single pair of anti-parallel coupled Co-containing layers (i.e., where N=1). Further, according to the exemplary embodiment shown illustrated in FIG. 1, there are an equal number of Co-containing and Ir-containing layers in the stack. This is however merely an example, and configurations are anticipated herein where differing numbers of Co-containing layers and Ir-containing layers are present in the reference layer stack.

Figure 1A:
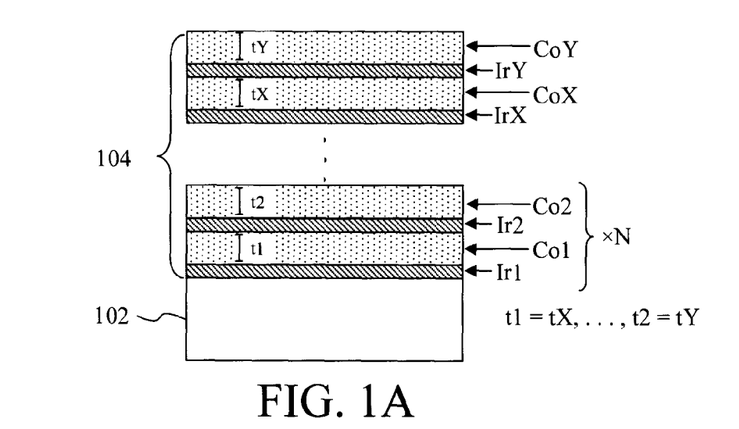
FIG. 1A is a cross-sectional diagram illustrating one exemplary configuration of the reference layer where for each (anti-parallel coupled) pair of the Co-containing layers in the stack, a same thickness is employed for the lower-in-the-stack/thicker Co-containing layer in each pair, and a same thickness is employed for the higher-in-the-stack/thinner Co-containing layer in each pair according to an embodiment of the present invention.

When determining the appropriate thickness of a given one of the Co-containing layers, it is preferable to take into account the location of that Co-containing layer in the stack. For instance, it has been found that, for each anti-parallel coupled pair of Co-containing layers in the stack, the Co-containing layer in the pair closer in the stack to the free layer will have a greater (magnetic moment) influence on the free layer than the Co-containing layer in the pair farther away in the stack from the free layer. To use the structure in FIG. 1 as an example, the free layer will be formed on top of the reference layer 104. Thus, in the example shown, Co1 and Co2 constitute an anti-parallel coupled (via Ir2) pair of Co-containing layers. Of that pair, Co2 will be relatively closer to the free layer than is Co1. Thus, to compensate for that greater influence due to closer proximity, the Co2 layer is preferably thinner than the Co1 layer. The same applies, for example, to anti-parallel coupled pair of CoX and CoY (coupled via IrY). What is important is that so long as $t1-t2>0, \ldots, tX-tY>0$, one can ensure that the overall moment will favor the layers that are relatively further away from the free layer. Further, since the Co-containing pairs are anti-parallel coupled repeats throughout the stack, then one only really needs to address the thickness of the Co-containing layers in a given anti-parallel coupled pair relative to one another. For instance, the thickness of Co2 need only be evaluated relative to the thickness of Co1, so as to ensure Co2 is thinner than Co1 for the above-stated reasons. Similarly, the thickness of CoY should be evaluated relative to the thickness of CoX, so as to ensure CoY is thinner than CoX. To illustrate this point, take for example, the case where N=2, and the reference layer stack includes only the four Co-containing layers—Co1, Co2, CoX, and CoY (and the corresponding Ir-containing layers). Co1 and CoX would have magnetic moments pointing in the same direction, as would Co2 and CoY. Thus while the thickness of Co2 relative to Co1 and the thickness of CoY relative to CoX is important, the thickness of Co2 relative to CoX is not an important consideration. By way of example only, an illustrative non-limiting example is shown in FIG. 1A wherein the same thickness is used for each of the lower-in-the-stack/thicker Co-containing layers in each anti-parallel coupled pair, e.g., t1 (of Co1) is equal to tX (of CoX). Similarly, the same thickness is used for each of the higher-in-the-stack/thinner Co-containing layers in each anti-parallel coupled pair, e.g., t2 (of Co2) is equal to tY (of CoY). It is by no means required that the reference layer stack have this particular configuration. However, FIG. 1A provides an example of a reference layer stack configuration that meets the above Co-containing layer thickness requirements.

Thus, according to an exemplary embodiment the thicknesses of the Co-containing layers are varied depending on the location of the layer in the stack. In general, in this example the Co-containing layer in each anti-parallel coupled pair of Co-containing layers that is (relatively) closer to the free layer (i.e., higher in the stack) will be thinner than the Co-containing layer in the anti-parallel coupled pair (relatively) farther away from the free layer (i.e., lower in the stack). To implement this configuration, one can simply decrease the thickness of the Co-containing layer formed when building each anti-parallel coupled pair of Co-containing layers. See, for example, FIG. 1 where Co-containing layers Co1 and Co2 have thicknesses t1 and t2, respectively. Thus, during fabrication, Co2 can be formed having a thickness that is less than Co1 (t2<t1). Similarly, Co-containing layers CoX and CoY have thicknesses tX and tY, respectively. Thus, during fabrication, CoY can be formed having a thickness that is less than CoX (tY<tX).

By way of example only, the first Co-containing layer (in a pair) can be deposited to a given thickness t1. The thickness of the next layer in the pair (and higher up in the stack) can then be reduced by from about 20% to about 50%. According to an exemplary embodiment, t1 is from about 5 Å to about 12.5 Å, and ranges therebetween. Thus, to give a simple example using the Co1-Co2 pair from FIG. 1, if the thickness t1 of Co1 is 5 Å, then a thickness t2 of Co2 can be 2.5 Å (a thickness reduction of 50%).

Figure 2:
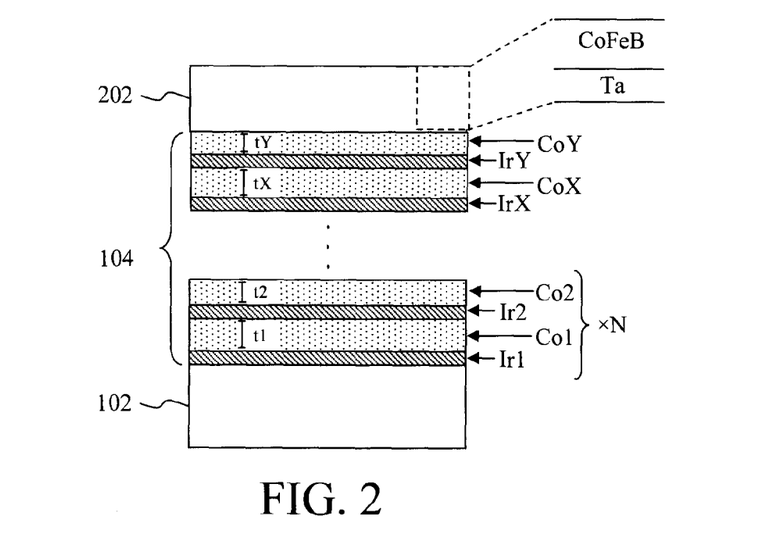
FIG. 2 is a cross-sectional diagram illustrating an interfacial layer (e.g., TaICoFeB) having been formed on a side of the reference layer opposite the substrate according to an embodiment of the present invention.
Figure 3:
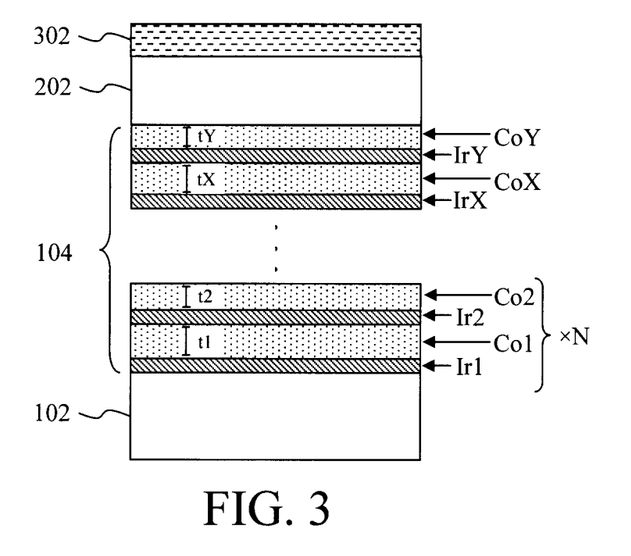
FIG. 3 is a cross-sectional diagram illustrating a tunneling barrier layer having been formed on a side of the interfacial layer opposite the reference layer according to an embodiment of the present invention.

Next, as shown in FIG. 2, an interfacial layer 202 is formed on a side of the reference layer 104 opposite the substrate 102. As is known in the art, the use of an interfacial layer increases magnetoresistance in magnetic tunnel junctions. According to an exemplary embodiment, the interfacial layer is formed from cobalt-iron-boron (CoFeB) with a tantalum (Ta) underlayer. The use of Ta/CoFeB interfacial layers in a magnetic tunnel junction is described, for example, in Worledge and in Sinha et al., "Enhanced interface perpendicular magnetic anisotropy in Ta|CoFeB|MgO using nitrogen doped Ta underlayers," arXiv:1305.6660 (June 2013) (hereinafter "Sinha"), the contents of which are incorporated by reference as if fully set forth herein. For instance, as described in Sinha a film stack was prepared using magnetron sputtering containing nitrogen doped Ta (TaN)|Co$_{20}$Fe$_{60}$B$_{20}$. This same Ta|CoFeB can be implemented in accordance with the present techniques as the interfacial layer 202. See, for example, FIG. 2.

A tunneling barrier layer 302 is then formed on a side of the interfacial layer 202 opposite the reference layer 104. See FIG. 3. According to an exemplary embodiment, the tunneling barrier layer 302 is formed from magnesium oxide (MgO). The use of a MgO tunneling barrier is described, for example, in Worledge and Sinha. As provided above, the MgO tunneling barrier may be formed using a sputtering process.

Figure 4:
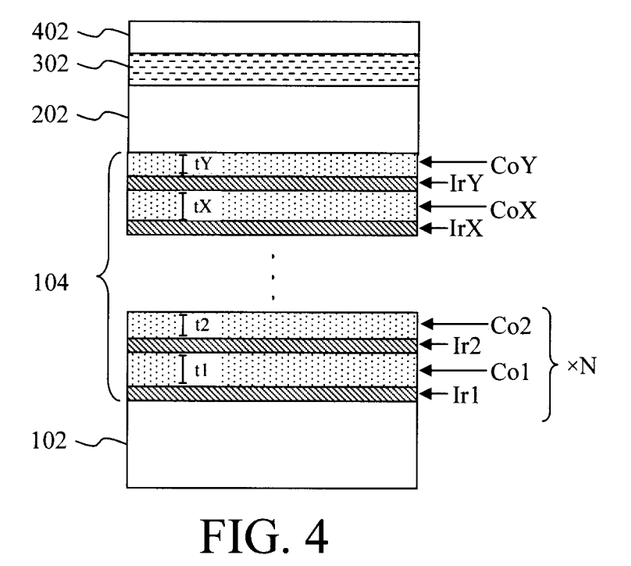
FIG. 4 is a cross-sectional diagram illustrating a free layer having been formed on a side of the tunneling barrier layer opposite the interfacial layer according to an embodiment of the present invention.

Next, as shown in FIG. 4, a free magnetic layer (or simply "free layer") 402 is formed on a side of the tunneling barrier layer 302 opposite the interfacial layer 202. According to an exemplary embodiment, free layer 402 is formed from CoFeB deposited using a sputtering process. See, for example, Worledge and Sinha. This free layer 402 and the above-described reference layer 104 which are separated by the tunneling barrier layer 302 form a magnetic tunnel junction. As described above, information is stored in the tunnel junction magnetic memory cell as an orientation of the magnetization of the free layer 402 as compared to an orientation of the magnetization of the reference layer 104, which according to the present techniques can be switched by driving a current through the magnetic tunnel junction— see below.

Figure 5:
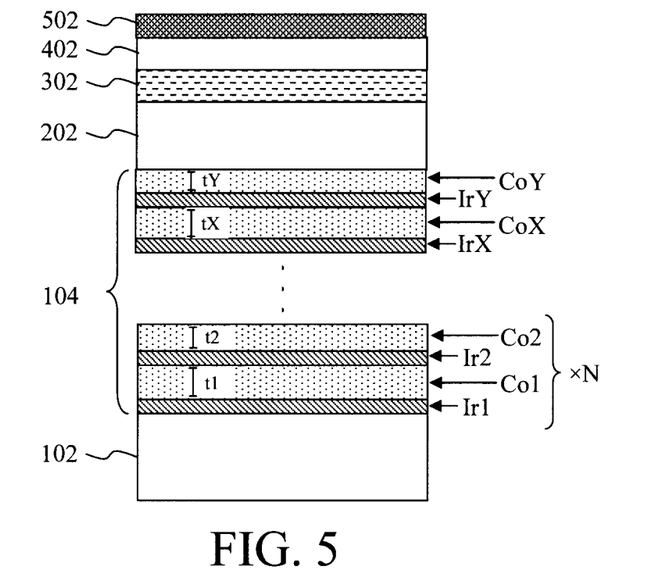
FIG. 5 is a cross-sectional diagram illustrating a capping layer having been formed on a side of the free layer opposite the tunneling barrier layer according to an embodiment of the present invention.

Finally, to complete the magnetic memory cell, a capping layer 502 is formed on a side of the free layer 402 opposite the tunneling barrier layer 302. According to an exemplary embodiment, the capping layer 502 is formed from tantalum (Ta) or a combination of Ru and Ta (i.e., a Ta layer and a Ru layer on the Ta layer) using sputtering. See, for example, U.S. Pat. No. 8,378,330 issued to Horng et al., entitled "Capping layer for a magnetic tunnel junction device to enhance dR/R and a method of making the same," the contents of which are incorporated by reference as if fully set forth herein.

It is notable that other configurations of the reference layer for use in accordance with the present techniques are possible. By way of example only, the multiple Co-containing layers in the reference layer stack as described above may be replaced with a subsystem of layers which contain alternating Co- and Pt-containing layers. For example, according to an alternative exemplary embodiment the present reference layer instead includes multiple subsystems oriented in a stack, wherein each of the subsystems includes two Co-containing layers separated by a Pt-containing layer, and wherein an Ir-containing layer is present between each adjacent subsystem in the stack. In this case, the Co-containing layers within each of the subsystems are parallel coupled via the Pt-containing layer, while the subsystems are anti-parallel coupled via the Ir-containing layer. This alternative exemplary embodiment is now described in detail by way of reference to FIGS. 6 and 7.

As with the first embodiment presented above, the process begins with the formation of the multilayer reference layer stack. See FIG. 6. In the exemplary embodiment shown, this multilayer reference layer (depicted generally as reference layer 604) is formed on a substrate 602. As provided above, the substrate 602 is preferably configured to serve as a seeding layer which provides a proper texture for building the reference layer constituent Co-, Pt-, and Ir-containing films having a desired (111) crystallographic orientation so as to enhance the perpendicular magnetic anisotropy of the reference layer stack. Suitable seeding layer materials include, but are not limited to, Pt, Ru, and Ir. According to an exemplary embodiment, the seeding layer has a thickness of greater than about 5 nm, for example, from about 5 nm to about 50 nm, and ranges therebetween.

Figure 6:
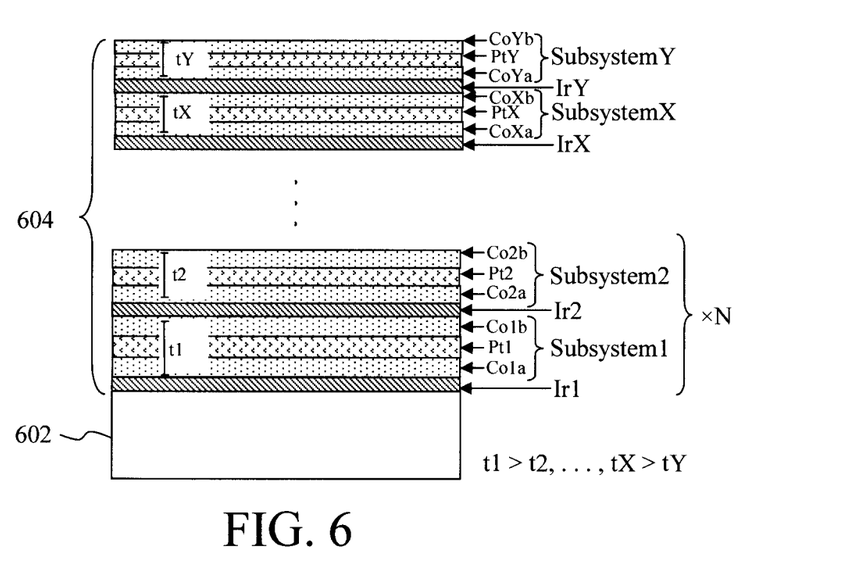
FIG. 6 is a cross-sectional diagram illustrating a reference layer having been formed on a (e.g., seeding layer) substrate, wherein the reference layer includes a stack of multiple Co-/Pt-/Co-containing layer subsystems separated by Ir-containing layers according to an embodiment of the present invention.

Next, as shown in FIG. 6, a multilayer stack of alternating Co-/Pt-/Co-(subsystem) and Ir-containing layers are next formed on the substrate 602. This multilayer stack will form the reference layer 604 of the present magnetic memory cell. The same techniques as described above also apply here except that instead of forming multiple Co-containing layers, multiple subsystems of Co-/Pt-/Co-containing (parallel-coupled) layers are formed. Otherwise the processes are the same.

As shown in FIG. 6, one of the Ir-containing layers will be present between each of the adjacent Co-/Pt-/Co-containing layer subsystems in the stack. These Ir-containing layers serve to anti-parallel couple the Co-/Pt-/Co-containing layer subsystems. By anti-parallel coupling the Co-/Pt-/Co-containing layer subsystems in the stack the net dipole moment is small. Thus, the reference layer induces at most a minimal dipole field on the free layer. Further, since the presence of the Ir-containing layers in the stack actually strengthens the perpendicular magnetic anisotropy (see above) here one can afford to have as many Ir-containing layers as possible. By comparison, the Ru employed in conventional configurations compromises the perpendicular magnetic anisotropy, and thus reference layers so configured to include Ru typically limit the Ru to a single layer in the stack.

Any suitable process known in the art may be employed to deposit/form the constituent layers of the reference layer stack. By way of example only, each of the layers of the present magnetic memory cell may be formed using a sputtering deposition technique, such as direct current (DC) sputtering. It would be within the capabilities of one skilled in the art to configure a sputtering or other standard deposition process to produce layers of the present materials having the particular compositions, thicknesses, etc. described herein.

Referring to FIG. 6, the process for forming the reference layer 604 begins by forming a first Ir-containing layer on the substrate 602. As provided above, the substrate 602 is preferably configured to serve (i.e., based on its composition, thickness, etc.) as a seeding layer to grow Ir-, Pt- and Co-containing layers thereon having a (111) crystallographic orientation. According to an exemplary embodiment, the Ir-containing layer is formed on the substrate 602 having a thickness of from about 4 Å to about 9 Å, and ranges therebetween, for example, from about 4.5 Å to about 5 Å, and ranges therebetween. As described above, the Ir-containing layers serve to anti-parallel couple the Co-containing layers in the stack thereby minimizing the net dipole moment. Thus, according to an exemplary embodiment, an Ir-containing layer thickness is chosen that gives the best anti-parallel coupling (based, for example, on electrical characteristics of test samples—see below) between Co-/Pt-/Co-containing layer subsystems (for example a thickness within the ranges provided above), and then that same thickness is employed for each of the Ir-containing layers in the stack.

Next, as shown in FIG. 6, a first Co-/Pt-/Co-containing layer subsystem Subsystem1 is formed on a side of the first Ir-containing layer Ir1 opposite the substrate 602, a second Ir-containing layer Ir2 is formed on a side of the first Co-/Pt-/Co-containing layer subsystem Subsystem1 opposite the first Ir-containing layer Ir1, and a second Co-/Pt-/Co-containing layer subsystem Subsystem2 is then formed on a side of the second Ir-containing layer Ir2 opposite the first Co-/Pt-/Co-containing layer subsystem Subsystem1, etc. In this configuration, the first Co-/Pt-/Co-containing layer subsystem Subsystem1 forms an anti-parallel coupled pair with the second Co-/Pt-/Co-containing layer subsystem Subsystem2 (via the second Ir-containing layer Ir2). Similarly, the $X^{th}$ Co-/Pt-/Co-containing layer subsystem SubsystemX forms an anti-parallel coupled pair with the $Y^{th}$ Co-/Pt-/Co-containing layer subsystem SubsystemY (via the $Y^{th}$ Ir-containing layer IrY), etc. Each of the Co-/Pt-/Co-containing layer subsystems in the stack can be formed by i) depositing a first Co-containing layer (in this case on a side of the first Ir-containing layer opposite the substrate 602), ii) depositing a Pt-containing layer on the first Co-containing layer (in this case on a side of the first Co-containing layer opposite the first Ir-containing layer)—which parallel couples the subsystems directly above and below it, and iii) depositing a second Co-containing layer on a side of the Pt-containing layer opposite the first Co-containing layer. For ease and clarity of description, each of the Ir-containing layers and the subsystems in the stack are given the designation Ir1, Subsystem1, Ir2, Subsystem2, . . . , IrX, SubsystemX, IrY, SubsystemY etc. which correspond to the first (Ir-containing layer and Subsystem), the second (Ir-containing layer and Subsystem), $X^{th}$ (Ir-containing layer and Subsystem), the $Y^{th}$ (Ir-containing layer and Subsystem) being formed. Further, within each of the subsystems, the constituent Co- and Pt- containing layers are given the designation Co1a, Pt1, Co1b, etc. which corresponds to the first (a) Co-containing layer, the Pt-containing layer, and the second (b) Co-containing layer being formed in the first subsystem1, etc.

As highlighted above, each pair of Co-/Pt-/Co-containing layer subsystems (i.e., Subsystem1/Subsystem2, . . . , SubsystemX/SubsystemY) are anti-parallel coupled via the Ir-containing layer therebetween. As shown in the figures, the stack will end up having N number of pairs of the Co-/Pt-/Co-containing layer subsystems. Having an even number of Co-/Pt-/Co-containing layer subsystems (i.e., the Co-/Pt-/Co-containing layer subsystems are present in the stack as (anti-parallel coupled) pairs) ensures that the magnetic moments of Co-/Pt-/Co-containing layer subsystems cancel each other out. According to an exemplary embodiment, N is from 1 to 5, and ranges therebetween, e.g., N is 3. It is thus notable that while FIG. 6 shows multiple anti-parallel coupled pairs, this is done to illustrate how the repeating pairs would be oriented in the stack, and the stack could in some exemplary embodiments include a single pair of anti-parallel coupled subsystems (i.e., where N=1). Further, according to the exemplary embodiment shown illustrated in FIG. 6, there are an equal number of Co-/Pt-/Co-containing layer subsystems and Ir-containing layers in the stack. This is however merely an example, and configurations are anticipated herein where differing numbers of Co-/Pt-/Co-containing layer subsystems and Ir-containing layers are present in the reference layer stack.

When determining the appropriate thickness of a given one of the Co-/Pt-/Co-containing layer subsystems (based on the thickness of the constituent layers in the given subsystem), in the same manner as described above it is preferable to take into account the location of that Co-/Pt-/Co-containing layer subsystems in the stack. For instance, it has been found that, for each anti-parallel coupled pair of Co-/Pt-/Co-containing layer subsystems in the stack, the subsystem in the pair closer in the stack to the free layer will have a greater (magnetic moment) influence on the free layer than the subsystem in the pair farther away in the stack from the free layer. To use the structure in FIG. 6 as an example, the free layer will be formed on top of the reference layer 604. Thus, in the example shown, Subsystem1 and Subsystem2 constitute an anti-parallel coupled (via Ir2) pair of Co-/Pt-/Co-containing layer subsystems. Of that pair, Subsystem2 will be relatively closer to the free layer than is Subsystem1. Thus, to compensate for that greater influence due to closer proximity, the Subsystem2 is preferably thinner than the Subsystem1. The same applies, for example, to the anti-parallel coupled pair of SubsystemX and SubsystemY (coupled via IrY). What is important is that so long as $t1-t2>0, \ldots, tX-tY>0$, one can ensure that the overall moment will favor the layers that are relatively further away from the free layer. Further, since the subsystem pairs are anti-parallel coupled repeats throughout the stack, then one only really needs to address the thickness of the subsystems in a given anti-parallel coupled pair relative to one another. For instance, the thickness of Subsystem2 need only be evaluated relative to the thickness of Subsystem1, so as to ensure Subsystem2 is thinner than Subsystem1 for the above-stated reasons. Similarly, the thickness of SubsystemY should be evaluated relative to the thickness of SubsystemX, so as to ensure SubsystemY is thinner than SubsystemX. To illustrate this point, take for example, the case where N=2, and the reference layer stack includes only the four subsystems—Subsystem1, Subsystem2, SubsystemX, and SubsystemY (and the corresponding Ir-containing layers). Subsystem1 and SubsystemX would have magnetic moments pointing in the same direction, as would Subsystem2 and SubsystemY. Thus while the thickness of Subsystem2 relative to Subsystem1 and the thickness of SubsystemY relative to SubsystemX is important, the thickness of Subsystem2 relative to SubsystemX is not an important consideration.

Thus, according to an exemplary embodiment the thicknesses of the Co-/Pt-/Co-containing layer subsystems are varied depending on the location of the subsystem in the stack. In general, in this example the subsystem in each anti-parallel coupled pair of subsystems that is (relatively) closer to the free layer (i.e., higher in the stack) will be thinner than the subsystem in the anti-parallel coupled pair (relatively) farther away from the free layer (i.e., lower in the stack). To implement this configuration, one can simply decrease the thickness of the Co-/Pt-/Co-containing layer subsystem formed when building each anti-parallel coupled pair of subsystems. See, for example, FIG. 6 where Subsystem1 and Subsystem2 have thicknesses t1 and t2, respectively. Thus, during fabrication, Subsystem2 can be formed having a thickness that is less than Subsystem1 (t2<t1). Similarly, SubsystemX and SubsystemY have thicknesses tX and tY, respectively. Thus, during fabrication, SubsystemY can be formed having a thickness that is less than SubsystemX (tY<tX).

By way of example only, the first Co-/Pt-/Co-containing layer subsystem (in a air) can be deposited to a given thickness t1. As provided above, the thickness of a given one of the subsystems is dependent on the thickness of the constituent Co- and Pt-containing layers. For simplicity, it is assumed herein that each of the constituent Co- and Pt-containing layers in a given one of the subsystems has the same thickness. Thus, each of the constituent Co- and Pt-containing layers in a given one of the subsystems can be deposited to a thickness that is ⅓ the desired thickness of the corresponding subsystem (since it is three of these layers, i.e., Coa, Pt, Cob, that make up each subsystem). The thickness of the next subsystem in the pair (and higher up in the stack) can then be reduced by from about 20% to about 50%. According to an exemplary embodiment, t1 is from about 7.5 Å to about 20 Å, and ranges therebetween. Thus, to give a simple example using the Subsystem1-Subsystem2 pair from FIG. 6, if the thickness t1 of Subsystem1 is 8 Å, then a thickness t2 of Subsystem2 can be 4.0 Å (a thickness reduction of 50%).

Reference can be made to FIG. 1A (described above) for a depiction of an exemplary case meeting these thickness requirements where the same thickness is used for each of the lower-in-the-stack/thicker Co-containing layers in each anti-parallel coupled pair, e.g., t1 (of Co1) is equal to tX (of CoX). Similarly, the same thickness is used for each of the higher-in-the-stack/thinner Co-containing layers in each anti-parallel coupled pair, e.g., t2 (of Co2) is equal to tY (of CoY). In this particular case, each Co1, Co2, . . ., CoX, CoY layer shown in FIG. 1A would represent one Co-/Pt-/Co-containing layer subsystem in the reference layer stack.

Figure 7:
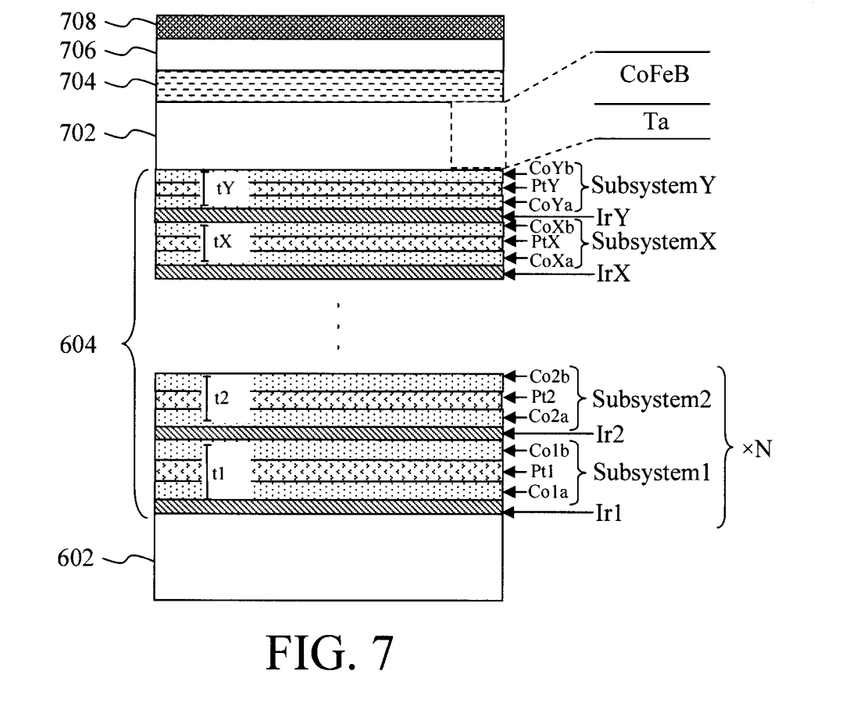
FIG. 7 is a cross-sectional diagram illustrating an interfacial layer having been formed on a side of the reference layer opposite the substrate, a tunneling barrier layer having been formed on a side of the interfacial layer opposite the reference layer, a free layer having been formed on a side of the tunneling barrier layer opposite the interfacial layer and a capping layer having been formed on a side of the free layer opposite the tunneling barrier layer according to an embodiment of the present invention.

The remainder of the process is the same as that described in conjunction with the description of FIGS. 1-5 above, and thus is depicted in a single figure, FIG. 7. As shown in FIG. 7, an interfacial layer 702 is formed on a side of the reference layer 604 opposite the substrate 602. According to an exemplary embodiment, the interfacial layer is formed from CoFeB with a Ta underlayer, i.e., Ta|CoFeB. See, for example, FIG. 7. A tunneling barrier layer 704 is then formed on a side of the interfacial layer 702 opposite the reference layer 604. According to an exemplary embodiment, the tunneling barrier layer 704 is formed from MgO.

A free layer 706 is formed on a side of the tunneling barrier layer 704 opposite the interfacial layer 702. According to an exemplary embodiment, free layer 706 is formed from CoFeB deposited using a sputtering process. This free layer 706 and the above-described reference layer 604 which are separated by the tunneling barrier layer 704 form a magnetic tunnel junction. As described above, information is stored in the tunnel junction magnetic memory cell as an orientation of the magnetization of the free layer 704 as compared to an orientation of the magnetization of the reference layer 604, which according to the present techniques can be switched by driving a current through the magnetic tunnel junction—see below.

Finally, to complete the magnetic memory cell, a capping layer 708 is formed on a side of the free layer 706 opposite the interfacial layer 704. According to an exemplary embodiment, the capping layer 708 is formed from Fe using sputtering.

Figure 8:
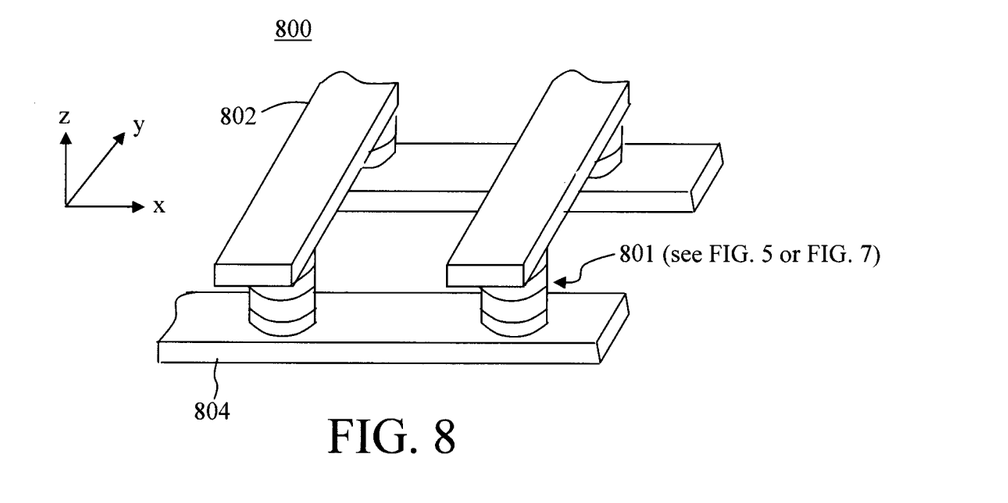
FIG. 8 is a diagram illustrating an exemplary magnetic memory cell array according to an embodiment of the present invention.

An array of the present magnetic memory cells may be employed as an MRAM device. See, for example, FIG. 8. FIG. 8 is a diagram illustrating a magnetic memory cell array 800. Magnetic memory cell array 800 includes bit lines 802 and word lines 804 running orthogonal to each other above and below a plurality of magnetic memory cells 801. Each of the magnetic memory cells 801 is representative of any of the magnetic memory cell configurations presented herein. For example, each magnetic memory cell 801 may be configured as the magnetic memory cell illustrated in FIG. 5 or as the magnetic memory cell illustrated in FIG. 7. The configuration of magnetic memory cell array 800 shown in FIG. 8 is merely exemplary, and other configurations are possible. By way of example only, magnetic memory cell array 800 can be configured to have bit lines 802 run below magnetic memory cells 801 and word lines 804 run above magnetic memory cells 801.

Methods for writing data to magnetic memory cell array 800 will be described in detail below. In general, however, each word line 804 applies a magnetic field $H_{word}$ along a y-axis of each magnetic memory cell 801, and each bit line 802 applies a magnetic field $H_{bit}$ along an x-axis of each magnetic memory cell 801. The y-axis comprises a hard switching axis of each magnetic memory cell 801 and the x-axis comprises an easy switching axis of each magnetic memory cell 801.

Figure 9:
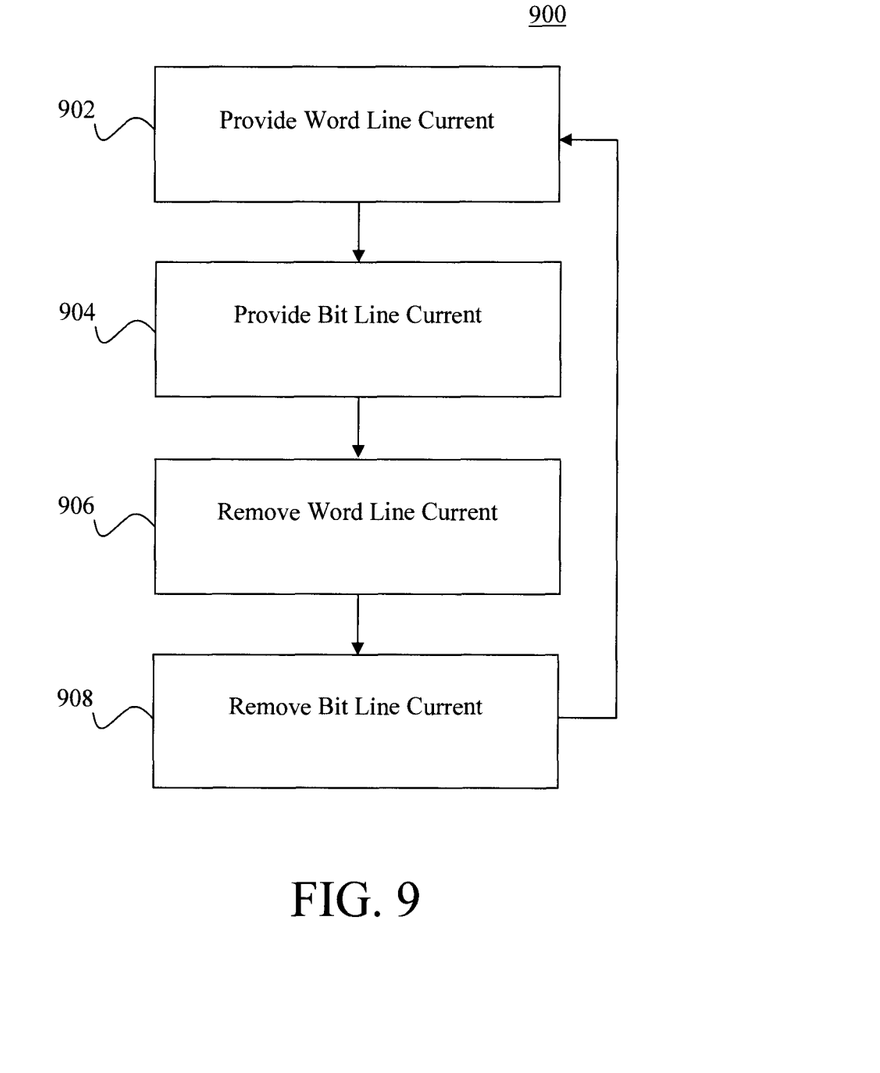
FIG. 9 is a diagram illustrating an exemplary methodology for writing data to a magnetic memory cell array according to an embodiment of the present invention.

FIG. 9 is a diagram illustrating exemplary methodology 900 for writing data to a magnetic memory cell array, such as magnetic memory cell array 800, described in conjunction with the description of FIG. 8, above, having a plurality of word lines oriented orthogonal to a plurality of bit lines and a plurality of magnetic memory cells (e.g., the magnetic memory cells of FIG. 5 or the magnetic memory cells of FIG. 7, both described above) therebetween.

In step 902, a current is passed along a given one of the word lines (a word line current) thereby selecting all of the magnetic memory cells on that given word line (i.e., the word line current destabilizes the magnetic memory cells, which essentially erases all pre-existing data and makes the magnetic memory cells easier to write). Namely, all of the magnetic memory cells on that given word line are selected to be written together at the same time. According to one exemplary embodiment, there are 128 magnetic memory cells per word line.

In step 904, each of the magnetic memory cells selected in step 902, above, is written by sending a small current through each corresponding bit line (a bit line current). For example, if 128 magnetic memory cells are selected in step 902 above, then a bit line current is sent through each of the 128 corresponding bit lines to write data to those 128 magnetic memory cells. The bit line current can be either a positive current or a negative current. A positive current will write a logic "1" to the corresponding magnetic memory cell, and a negative current will write a logic "0" to the corresponding magnetic memory cell.

In step 906, the word line current is removed. In step 908, the bit line current is removed. As a result, data (i.e., either a logic "1" or a logic "0") is written to each of the magnetic memory cells selected in step 902, above.

The present techniques are further illustrated by way of reference to the following non-limiting examples.

Figure 10A:
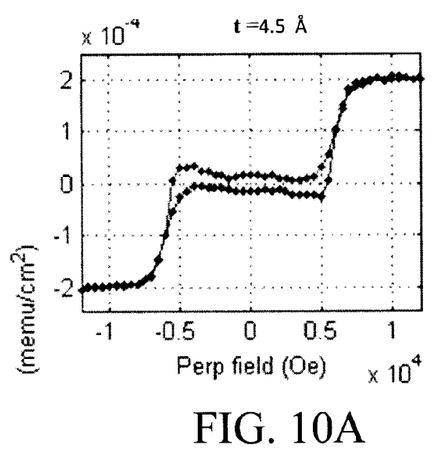
FIG. 10A is a diagram illustrating antiferromagnetic coupling of Co-containing layers via an Ir-containing layer having a thickness of 4.5 angstroms according to an embodiment of the present invention.
Figure 10B:
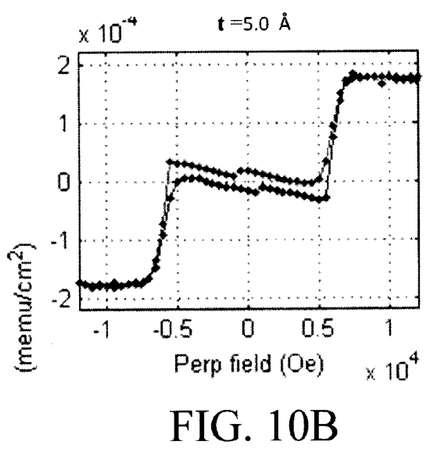
FIG. 10B is a diagram illustrating antiferromagnetic coupling of Co-containing layers via an Ir-containing layer having a thickness of 5.0 angstroms according to an embodiment of the present invention.

To determine the thickness of the Ir-containing layers used in the multilayer reference stack, the following structure was fabricated:

30Ta/50Ru/30Pd/6×[2.5Co/2Pd]/5Co/tIr/2.5Co/6×[2.5Co/2Pd]/30Pd wherein the values of t=4, 4.5, 5, 5.5, 6, 7, 8, 9 Å were evaluated. All thickness values are given in angstroms. The Ir thickness values found to give the best antiferromagnetic coupling were t=4.5 Å and t=5 Å, see FIGS. 10A and 10B respectively.

To evaluate the thickness for each pair of the Co-containing layers in the multilayer reference stack, the following structure was fabricated:

30Ta/50Ir/3×[t1 Co/5Ir/t2 Co/5Ir]/30Pd wherein the following values for t1 and t2 of the Co-containing layers were evaluated:

t1=5, t2=2.5 t1=7.5, t2=5 t1=10, t2=7.5 t1=12.5, t2=10

Figure 11A:
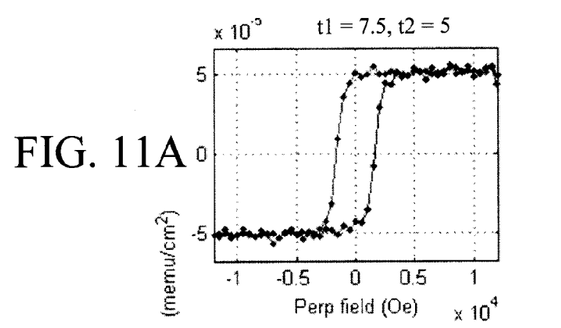
FIG. 11A is a diagram illustrating perpendicular magnetic anisotropy (perpendicular loop) of a pair of Co-containing layers having a thickness t1=7.5 and t2=5 according to an embodiment of the present invention.
Figure 11B:
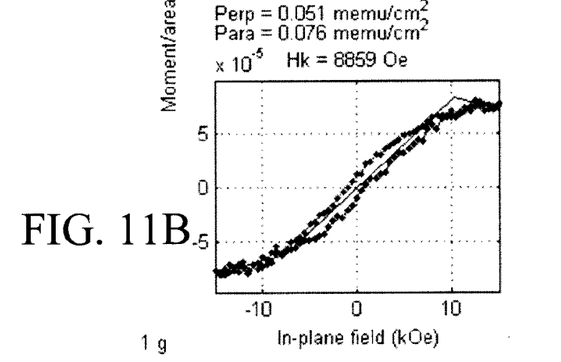
FIG. 11B is a diagram illustrating perpendicular magnetic anisotropy (inplane loop) of a pair of Co-containing layers having a thickness t1=7.5 and t2=5 according to an embodiment of the present invention.

All thickness values are given in angstroms. The t1 and t2 thickness values of the Co-containing layers found to give the best perpendicular magnetic anisotropy was t1=7.5, t2=5, see FIGS. 11A and 11B.

To evaluate the function of the seeding layer, the following seeding layer configurations were tested (both at room temperature and at 250° C. sample growth temperatures):

30Ta/50Ir/3×[10 Co/5Ir/7.5 Co/5Ir]/30Pd

30Ta/50Pd/3×[10 Co/5Ir/7.5 Co/5Ir]/30Pd

30Ta/50Ru/3×[10 Co/5Ir/7.5 Co/5Ir]/30Pd

30Ta/50Ir/3×[10 Co/5Ir/7.5 Co/5Ir]/30Pd (seeding layer at 250° C.)

30Ta/50Pd/3×[10 Co/5Ir/7.5 Co/5Ir]/30Pd (seeding layer at 250° C.)

30Ta/50Ru/3×[10 Co/5Ir/7.5 Co/5IR]/30Pd (seeding layer at 250° C.)

All thickness values are given in angstroms. The Ir seeding layer prepared at room temperature was found to provide the best saturation field. It is notable that the example depicted in FIGS. 11A and 11B also used Ir as the seeding layer and only the Co-containing layer thickness was varied.

Further, an evaluation of the performance of the present magnetic memory cells after an anneal at 300° C. and 360° C. was performed to determine the stability of the reference layer. After the anneal at 300° C., the resistance area was 25.9 and the magnetoresistance was 71%. After the anneal at 360° C., the resistance area was 30.3 and the magnetoresistance was 64%. Thus, the reference layer proved to be stable even after an anneal at these elevated temperatures.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A magnetic memory cell, comprising:
   a reference magnetic layer comprising multiple cobalt (Co)-containing layers oriented in a stack, wherein adjacent Co-containing layers in the stack are separated by an iridium (Ir)-containing layer such that the adjacent Co-containing layers in the stack are anti-parallel coupled by the Ir-containing layer therebetween, and wherein an even number of the Co-containing layers is present in the stack such that the stack comprises a positive integer N number of pairs of the Co-containing layers; and
   a free magnetic layer separated from the reference magnetic layer by a barrier layer,
   wherein a thickness of the Co-containing layers in each of the pairs depends on a location of the Co-containing layers in the stack relative to the free magnetic layer such that in each of the pairs, the Co-containing layer located in the stack closer to the free magnetic layer is thinner than the Co-containing layer located in the stack farther away from the free magnetic layer.

2. The magnetic memory cell of claim 1, wherein N is from 1 to 5.

3. The magnetic memory cell of claim 2, wherein N is 3.

4. The magnetic memory cell of claim 1, wherein a given one of the pairs comprises a first Co-containing layer having a thickness t1 and a second Co-containing layer having a thickness t2, wherein the second Co-containing layer is located in the stack above the first Co-containing layer, and wherein t2<t1.

5. The magnetic memory cell of claim 1, further comprising:
   a seeding layer adjacent to the reference magnetic layer, wherein the seeding layer comprises platinum (Pt), ruthenium (Ru), or Ir.

6. The magnetic memory cell of claim 5, wherein the seeding layer has a thickness of from about 5 nm to about 50 nm, and ranges therebetween.

7. The magnetic memory cell of claim 1, further comprising:
   an interfacial layer between the reference magnetic layer and the free magnetic layer.

8. The magnetic memory cell of claim 7, wherein the interfacial layer comprises cobalt-iron-boron (CoFeB) with a tantalum (Ta) underlayer.

9. The magnetic memory cell of claim 1, wherein the free magnetic layer comprises CoFeB.

10. A magnetic memory cell, comprising:
a reference magnetic layer comprising multiple subsystems of layers oriented in a stack, wherein each of the subsystems of layers comprises a first Co-containing layer separated from a second Co-containing layer by a Pt-containing layer such that the first Co-containing layer and the second Co-containing layer are parallel coupled by the Pt-containing layer therebetween, and wherein adjacent subsystems of layers in the stack are separated by an Ir-containing layer such that the adjacent subsystems of layers in the stack are anti-parallel coupled by the Ir-containing layer therebetween, and wherein an even number of the subsystems of layers is present in the stack such that the stack comprises a positive integer N number of pairs of the subsystems of layers; and
a free magnetic layer separated from the reference magnetic layer by a barrier layer,
wherein a thickness of the subsystems of layers in each of the pairs depends on a location of each of the subsystems of layers in the stack relative to the free magnetic layer such that in each of the pairs, the subsystem of layers located in the stack closer to the free magnetic layer is thinner than the subsystem of layers located in the stack farther away from the free magnetic layer.

11. The magnetic memory cell of claim 10, wherein N is from 1 to 5.

12. The magnetic memory cell of claim 11, wherein N is 3.

13. The magnetic memory cell of claim 10, further comprising:
a seeding layer adjacent to the reference magnetic layer, wherein the seeding layer comprises Pt, Ru, or Ir.

14. The magnetic memory cell of claim 10, further comprising:
an interfacial layer between the reference magnetic layer and the free magnetic layer.

15. The magnetic memory cell of claim 14, wherein the interfacial layer comprises CoFeB with a Ta underlayer.

* * * * *